US006228278B1

(12) United States Patent
Winniczek et al.

(10) Patent No.: US 6,228,278 B1
(45) Date of Patent: May 8, 2001

(54) METHODS AND APPARATUS FOR DETERMINING AN ETCH ENDPOINT IN A PLASMA PROCESSING SYSTEM

(75) Inventors: Jaroslaw W. Winniczek, Daly City; M. J. Francois Chandrasekar Dassapa, Fremont; Eric A. Hudson, Berkeley; Mark Wiepking, Santa Clara, all of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/164,389

(22) Filed: Sep. 30, 1998

(51) Int. Cl.[7] .............................................. G01R 31/00

(52) U.S. Cl. .............................. 216/61; 216/59; 438/14; 438/16

(58) Field of Search .............................. 156/345, 627, 156/643, 626; 216/59, 61; 438/14, 17

(56) References Cited

U.S. PATENT DOCUMENTS

| | | | |
|---|---|---|---|
| 4,381,965 | 5/1983 | Maher, Jr. et al. | 156/345 |
| 4,473,435 | 9/1984 | Zafiropoulo et al. | 156/643 |
| 5,013,400 | 5/1991 | Kurasaki et al. | 156/643 |
| 5,045,149 | 9/1991 | Nulty | 156/627 |
| 5,198,072 * | 3/1993 | Gabriel | 216/59 |
| 5,248,371 | 9/1993 | Maher et al. | 156/345 |
| 5,308,414 | 5/1994 | O'Neill et al. | 156/626 |
| 5,557,215 | 9/1996 | Saeki et al. | 324/765 |
| 5,665,166 | 9/1997 | Deguchi et al. | 118/723 E |
| 5,708,250 | 1/1998 | Benjamin et al. | 219/121.58 |
| 5,737,175 | 4/1998 | Grosshart et al. | 361/234 |
| 5,812,361 | 9/1998 | Jones et al. | 361/234 |
| 5,933,314 * | 8/1999 | Lambson et al. | 361/234 |

FOREIGN PATENT DOCUMENTS

| | | | |
|---|---|---|---|
| 0 660 378 A1 | 6/1995 | (EP) | H01L/21/00 |
| WO99/00889 | 1/1999 | (WO) | H02N/13/00 |

OTHER PUBLICATIONS

International Search Report, dated Feb. 8, 2000.

* cited by examiner

*Primary Examiner*—Randy Gulakowski
*Assistant Examiner*—Shamim Ahmed
(74) *Attorney, Agent, or Firm*—Beyer Weaver & Thomas LLP

(57) ABSTRACT

Methods and apparatus for ascertaining the end of an etch process while etching through a target layer on a substrate in a plasma processing system which employs an electrostatic chuck. The end of the etch process is ascertained by monitoring the electric potential of the substrate to detect a pattern indicative of the end of the etch process. By the way of example, changes to this potential may be observed by monitoring the current flowing to the pole of the electrostatic chuck. Upon ascertaining the pattern indicative of the end of the etch process, for example by monitoring the current signal, a control signal is produced to terminate the etch. If a bias compensation power supply is provided to keep the currents flowing to the poles of the electrostatic chuck substantially equal but opposite in sign throughout the etch, the compensation voltage output by the bias compensation power supply may be monitored for the aforementioned pattern indicative of the end of the etch process in order to terminate the etch.

10 Claims, 4 Drawing Sheets

PR
202
200
204
208
210
212
TARGET LAYER
UNDERLYING FILMS(S)
206
SUBSTRATE
207
220
214
218
230
232
234
236
216
RF
224
ENDPOINT MONITORING CIRCUITRY
402
404
250
248
242
240
238

METHODS AND APPARATUS FOR DETERMINING AN ETCH ENDPOINT IN A PLASMA PROCESSING SYSTEM

BACKGROUND OF THE INVENTION

The present invention relates to the manufacture of semiconductor devices. More particularly, the present invention relates to improved techniques for ascertaining the end of an etch process for endpointing purposes while etching through a selected layer on a substrate.

In the manufacture of semiconductor devices, such as integrated circuits or flat panel displays, the substrate (e.g., the wafer or the glass panel) may be processed in a plasma processing chamber. Processing may include the deposition of layers of materials on the substrate and the selective etching of the deposited layer(s). To prepare a layer for etching, the substrate surface is typically masked with an appropriate photoresist or hard mask. During etching, a plasma is formed from the appropriate etchant source gas to etch through regions unprotected by the mask. The etching is terminated once it is determined that the target layer is etched through. This termination of the etch is typically referred to as the etch "endpoint."

To determine when to terminate an etch, many techniques have been employed in the art. By way of example, the etch may be terminated upon the expiration of a predefined period of time. The predefined period of time may be empirically determined in advance by etching a few sample substrates prior to the production run. However, there is no allowance made for substrate-to-substrate variations as there is no feedback control.

More commonly, the end of an etch process may be dynamically ascertained by monitoring the optical emission of the plasma. When the target layer is etched through, the optical emission of the plasma may change due to the reduced concentration of the etch byproducts, the increased concentration of the etchants, the increased concentration of the byproducts formed by reaction with the material(s) of the underlayer, and/or due to the change in the impedance of the plasma itself.

It has been found, however, that the optical emission-based technique has some disadvantages. By way of example, the use of some etchants and/or additive gases interferes with the optical emission endpoint technique, giving rise to inaccurate readings. As a further example, as the feature sizes decrease, the amount of film exposed to the plasma through openings in the mask is also reduced. Accordingly, the amount of byproduct gases that is formed from reactions with the exposed film reduces, rendering signals that rely on plasma optical emission less reliable.

It has been found that, as the target layer etch is completed and the underlayer is exposed to the plasma, the self-induced bias of the substrate may change. By way of example, for the etch of a dielectric target layer, the self-induced bias of the substrate is observed to change as a conductive underlayer is exposed to the plasma. As a further example, for the etch of a conductive target layer, the self-induced bias of the substrate is observed to change when a dielectric underlayer is exposed to the plasma. By monitoring the change in the self-induced bias of the substrate, the end of the etch process may be ascertained for endpointing purposes.

To facilitate discussion, FIG. 1 illustrates a typical endpointing arrangement wherein the self-induced bias on the wafer is monitored to determine when the target layer is etched through for the purpose of endpointing the etch. As shown in FIG. 1, a wafer 102 is shown disposed on an electrode 104, which is typically made of a metallic material. Electrode 104, which functions as a chuck in this example, is energized by an RF power source 106 through a capacitor 108. During etching, the self-induced bias on wafer 102 is detected at a node 110 through a monitoring circuit 112. Monitoring circuit 112 include a low pass filter 114, which blocks the RF component of the signal and allows only the DC component to pass through. Since the self-induced bias on the wafer tends to be in the hundreds of volts, the signal that is passed through low pass filter 114 is typically stepped down through a voltage divider circuit to allow the monitoring electronics (not shown to simplify the discussion) to monitor the change in the self-induced bias on wafer 102. This information pertaining to changes in the self-induced bias on the wafer allows the endpointing electronics to determine when the etch should be terminated.

However, the sensitivity and accuracy of the monitoring technique discussed in FIG. 1 may degrade as the percentage of the target film exposed to the plasma decreases and/or if the DC conductivity between the plasma and the electrode is decreased (e.g., due to the presence of a dielectric layer underlying the target layer to be etched). Furthermore, the monitoring technique of FIG. 1 is typically ineffective when electrostatic chucks are employed. This is because electrostatic chucks typically employ a dielectric layer between the conductive chuck body and the substrate. The presence of this dielectric layer interferes with the current path between the plasma and the chuck, rendering it very difficult to accurately determine the self-induced bias on the wafer at node 110. Furthermore, the relationship between the voltage detected at node 110 and the self-induced bias on wafer 102 is not linear. By way of example, the resistance of the electrostatic chuck depends, in part, on the voltage existing on the chuck. Accordingly even if a signal can be detected at node 110, it is difficult to correlate the signal detected with the self-induced bias on the substrate for endpointing purposes.

In view of the foregoing, there are desired improved techniques for detecting the end of a plasma etch process for endpointing purposes.

SUMMARY OF THE INVENTION

The invention relates to methods and apparatus for ascertaining the end of an etch process while etching through a target layer on a substrate in a plasma processing system. This invention exploits the change in the electric potential of the substrate which, for many different etch applications, corresponds to the end of the etch process. In one embodiment, the endpointing arrangement includes a current monitoring circuit configured to monitor the current flowing to a pole of the electrostatic chuck to detect a pattern indicative of the end of the etch process. Upon ascertaining the pattern indicative of the end of the etch process in the current signal, a control signal is produced to terminate the etch.

In another embodiment, the chuck represents a bipolar electrostatic chuck and currents flowing to both poles of the electrostatic chucks are monitored for the aforementioned pattern indicative of the end of the etch process in order to terminate the etch. In yet another embodiment, the differential of the currents supplied to the poles of the electrostatic chuck is monitored for the aforementioned pattern indicative of the end of the etch process in order to terminate the etch.

In yet another embodiment, the electrostatic power supply includes a bias compensation power supply, which monitors currents supplied to the electrostatic chuck poles and outputs a compensation voltage responsive thereto. The compensation voltage is then input into the chuck power supply in order to keep the currents supplied to the poles substantially equal but opposite in sign throughout the etch. In this embodiment, the compensation voltage is monitored for the aforementioned pattern indicative of the end of the etch process in order to terminate the etch.

These and other advantages of the present invention will become apparent upon reading the following detailed descriptions and studying the various drawings.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1:
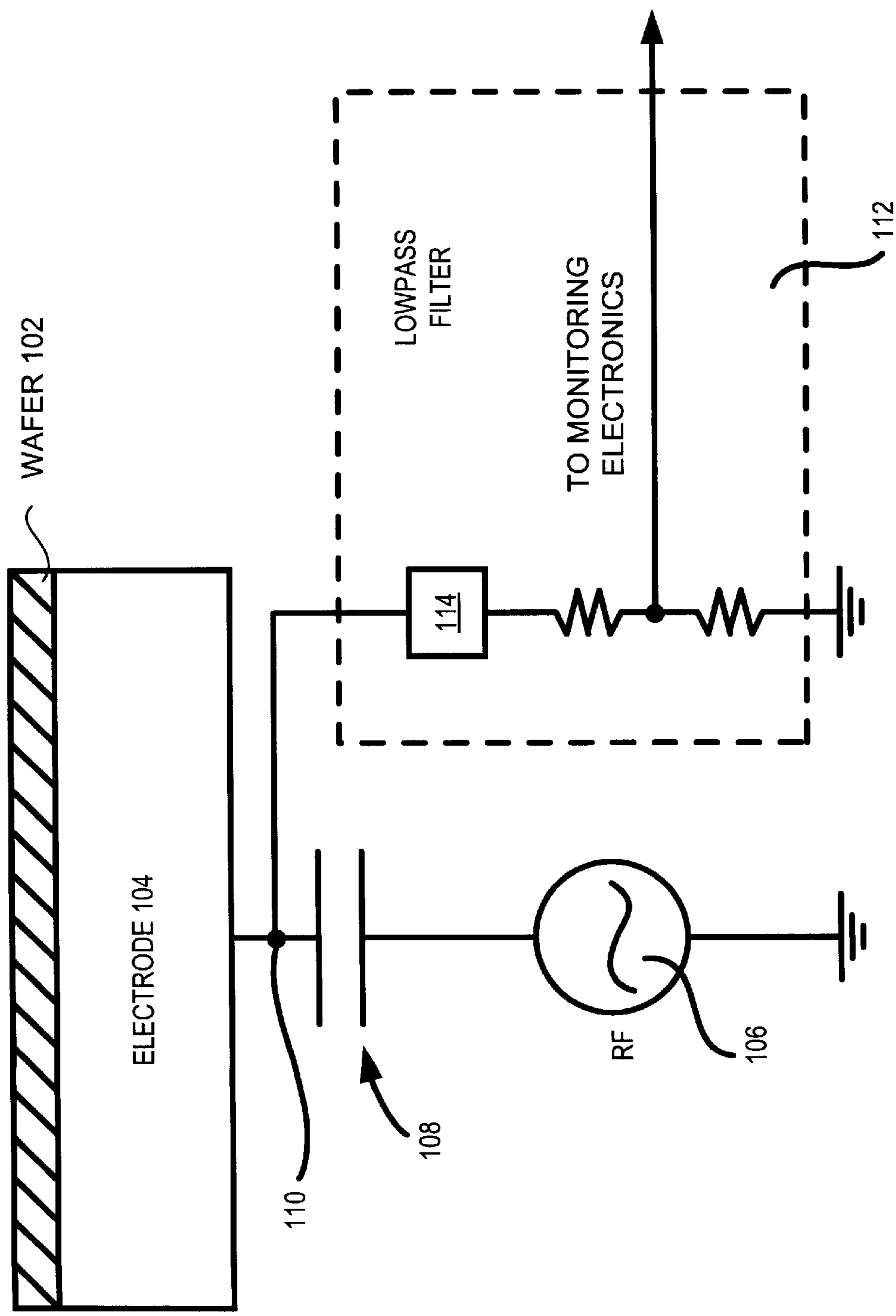
FIG. 1 illustrates a typical endpointing arrangement wherein the self-induced bias on the wafer is monitored to determine when the target layer is etched through for the purpose of endpointing the etch.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to avoid unnecessarily obscuring the present invention.

It is appreciated by the inventors herein that as the etch progresses through a target layer, and particularly as the target layer is etched through to the underlayer, the electric potential of the substrate changes. The change in the substrate potential is particularly pronounced at the end of the etch. While not wishing to be bound by theory, it is believed that, as the target layer is etched through, the capacitive and resistive coupling between the substrate and the plasma changes. As one possible explanation, the self-induced bias on the substrate may change due to the increased current leakage between the plasma and the substrate as the etch features (such as vias or trenches) are etched down to a stop layer. It is also possible that the properties of the plasma itself are changed as the target layer is etched through. This change brings about a change in the plasma impedance, which in tun changes the self-induced bias on the substrate.

When an electrostatic chuck is employed in the plasma processing system, direct measurement of the substrate electric potential is difficult, because the dielectric layer of the ESC introduces a large resistance between the substrate and the electrical measurement circuitry. The present invention overcomes these difficulties.

It is appreciated by the inventors herein that changes in the substrate electric potential cause variations in the current flowing from the ESC power supply to the poles of the electrostatic chuck. In one of the embodiments of the present invention, the currents flowing to the poles of the electrostatic chuck are monitored. In this manner, the change of substrate potential associated with the end of the etch process may be ascertained, and the information derived therefrom may be employed to endpoint the etch.

More preferably, some electrostatic chuck power supplies employ a compensation circuit to keep the currents flowing to the poles of the electrostatic chucks substantially equal in magnitude but opposite in sign. Compensation circuits are employed since if electrostatic forces between the chuck poles and the overlying substrate regions vary during an etch, inconsistent chucking, inconsistent heat transfer, and undesirable etch results may occur. In some systems, however, the compensation circuit may be employed to keep the currents flowing to the poles of the electrostatic chuck substantially constant (i.e., relatively unchanging even if they are unequal throughout the etch).

In general, the compensation circuit typically monitors the currents flowing to the poles of the electrostatic chuck and provides a control signal to a variable bias compensation power supply. When the currents flowing to the poles of the electrostatic chuck poles change, the changing control signal varies the voltage output by a bias compensation power supply. The voltage output by the bias compensation power supply, referred to herein as the compensation voltage, is then employed to offset the voltages supplied to the chuck poles in order to keep the currents flowing to the electrostatic chuck poles substantially equal in magnitude but opposite in sign (or substantially constant in other systems as mentioned earlier).

It is discovered by the inventors that the compensation voltage changes as the etch progresses and typically changes dramatically as the target layer is cleared, i.e., etched through. In accordance with one embodiment of the present invention, information regarding end of the etch process may be obtained by monitoring the compensation voltage in order to endpoint the etch.

Figure 2:
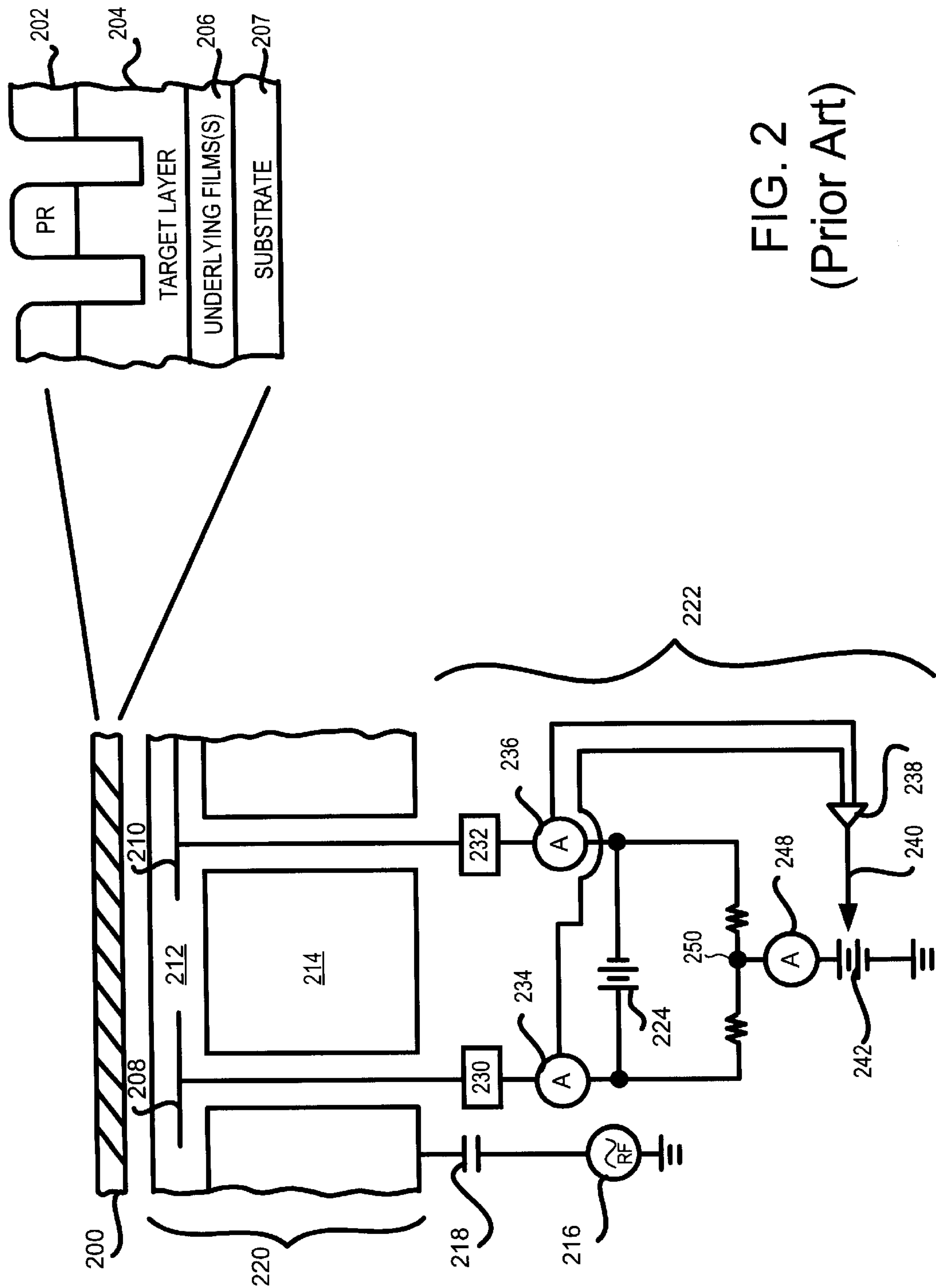
FIG. 2 is a simplified illustration of a compensation arrangement for keeping the currents supplied to the chuck poles substantially equal in magnitude but opposite in sign as the etch progresses.

To facilitate discussion, FIG. 2 is a simplified illustration of a compensation arrangement for keeping the currents supplied to the chuck poles substantially equal but opposite in sign as the etch progresses. It should be kept in mind, however, that while the compensation arrangement of the exemplary embodiment functions to keep the currents supplied to the chuck poles substantially equal but opposite in sign, the concepts disclosed herein also apply equally to compensation arrangements that keep the currents flowing to the poles substantially unchanging (i.e., relatively unchanging even if they are unequal throughout the etch). The adaptation of the exemplary arrangement to work with such a compensation circuit is well within the skills of one of ordinary skills in the art given this disclosure.

With reference to FIG. 2, the object to be processed 200, e.g. a wafer or glass panel, includes the target layer to be etched, and is represented in a simplified manner by a photoresist mask layer 202, a target layer 204, underlayer film or films 206, and the substrate 207. Target layer 204 may represent any layer to be etched through. In one example, target layer 204 represents a silicon dioxide-containing layer such as a doped CVD (chemical vapor deposition) or PECVD (plasma-enhanced chemical vapor deposition) glass layer. In another example, target layer 204 may represent a low dielectric constant (low-k dielectric)

layer. In yet another example, target layer 204 represents a metal layer or polysilicon (doped or undoped) to be etched. Underlayer film or films 206 may include any and all layers and/or structures that underlie target layer 204. Underlayer film or films 206 may include, for example, one or more conductive (metallic or doped polysilicon) layers and/or one or more dielectric layers. By way of example, an etch stop layer may be disposed immediately below target layer 204 and may be formed of, for example, silicon nitride, titanium silicide, or titanium nitride material. Substrate 207 represents the supporting material of the object to be etched, for example, a wafer or glass panel. For the sake of discussion in the present example, substrate 207 does not include the layers and/or device structures which may be present on its surface, which are instead represented by the aforementioned layers 202, 204, and 206. In some cases, the underlayer film or films 206 may be absent, and the target layer 204 is disposed directly on the substrate 207.

In the example of FIG. 2 a Johnsen-Rahbek chuck is employed although the invention is believed to work with any type of electrostatic chuck such as monopole ESC chucks, multipole ESC chucks of any configuration, or the like. The construction of a Johnsen-Rahbek chuck is well known in the art and will not be discussed in detail here for brevity's sake. Further, although the chuck poles are of a concentric configuration in the example of FIG. 2, the poles of the electrostatic chuck may assume any configuration and/or geometry (e.g., inter-digitated). For the concentric Johnsen Rahbek chuck of the example of FIG. 2, an outer pole 208 and an inner pole 210 are embedded in a slightly conductive layer 212, which may be formed of, for example, a ceramic material that is lightly doped for conductivity. An RF electrode 214, which is disposed below slightly conductive layer 212, is typically formed of a metallic material and is coupled to an RF power supply 216 through a capacitor 218. To facilitate chucking, the poles of chuck 220 are coupled to an electrostatic power supply 222.

Electrostatic chuck power supply 222 includes a main power supply 224, which supplies the DC chucking voltages to the poles of chuck 220. Low pass filters to 230 and 232 are interposed between poles 208 and 210 and electrostatic chuck power supply 222 to couple main power supply 224 to poles 208 and 210 of chuck 220 and to isolate RF power 216 from power supply 222. Current monitoring circuits 234 and 236 are coupled in series with the current paths between the poles of the electrostatic chuck and ESC power supply 222 to monitor the currents in these legs.

Each of current monitor circuits 234 and 236 may be implemented by a simple resistive arrangement, and the potential difference across each may be ascertained to determine the current flowing to each of poles 208 and 210. The outputs of current monitor circuits 234 and 236 are input into a comparator circuit 238, which may represent, for example, a differential amplifier circuit. Comparator circuit 238 outputs a control signal 240 for controlling a variable bias compensation power supply 242. Bias compensation power supply 242 changes its output responsive to control signal 240. The output of bias compensation power supply 242 is employed to bias main power supply 224 to keep the currents flowing to poles 208 and 210 substantially equal in magnitude and opposite in sign. The arrangement of FIG. 2, including the bias compensation arrangement in electrostatic chuck power supply 222, is well known in the art.

As target layer 204 is etched through, the compensation voltage at node 250 changes as the compensation circuit attempts to keep the currents flowing to poles 208 and 210 substantially equal. It is appreciated by the inventors herein that the information contained in the compensation voltage, which is found either in control signal 240 or at node 250 at the output of bias compensation power supply 242, includes information pertaining the progress of the etch and particularly pertaining when the end of the etch occurs. This is because, as explained earlier, the electric potential of the substrate 207 changes as the etch progresses, and causes the currents flowing to each of the poles 208 and 210 to change. These changes are detected by current monitor circuits 234 and 236 to produce a control signal 240, which serves as the feedback signal to bias compensation power supply 242, whose job it is to bias main power supply 224 to keep the currents flowing to poles 208 and 210 substantially equal.

Figure 3:
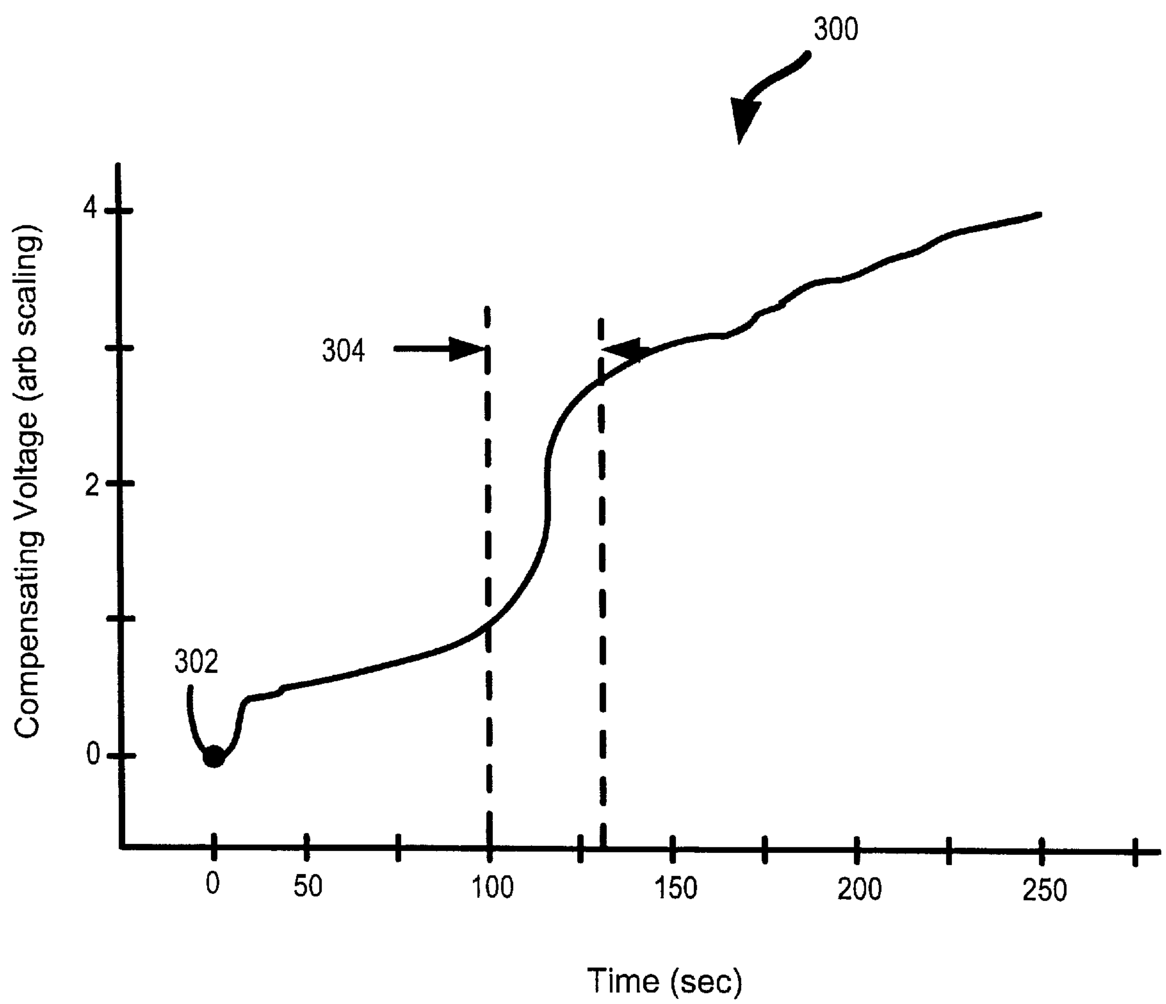
FIG. 3 illustrates a typical compensation voltage as the etch progresses through the target layer.

FIG. 3 illustrates a typical compensation voltage as the etch progresses through the target layer. At point 302, the etch begins on compensation voltage plot 300. As the etch progress, the compensation voltage changes. Although the change is illustrated in FIG. 3 by an increasing compensation voltage, the compensation voltage may change in other ways, such as decreasing, as the etch progresses in other substrates. As the etch clears the target layer, a significant change in the compensation voltage is typically observed. Although the end of the etch is evidenced by a steep upward slope in the vicinity of region 304 in FIG. 3, the end of the etch may also be evidenced (in other etch processes) by a sharp downward slope, a spike or a sudden dip in the signal. Irrespective of the exact shape of the compensation voltage plot at the time the etch ends, the end of the etch is typically evidenced by a clearly discernible change in the compensation voltage. The specific characteristic shape of the compensation voltage plot at the time the etch ends may be ascertained by performing sample etches on sample wafers. Thereafter, the monitoring circuitry may be instructed to look for the ascertained characteristic shape in the compensation plot that signals the end of the etch for endpointing purposes.

Figure 4:
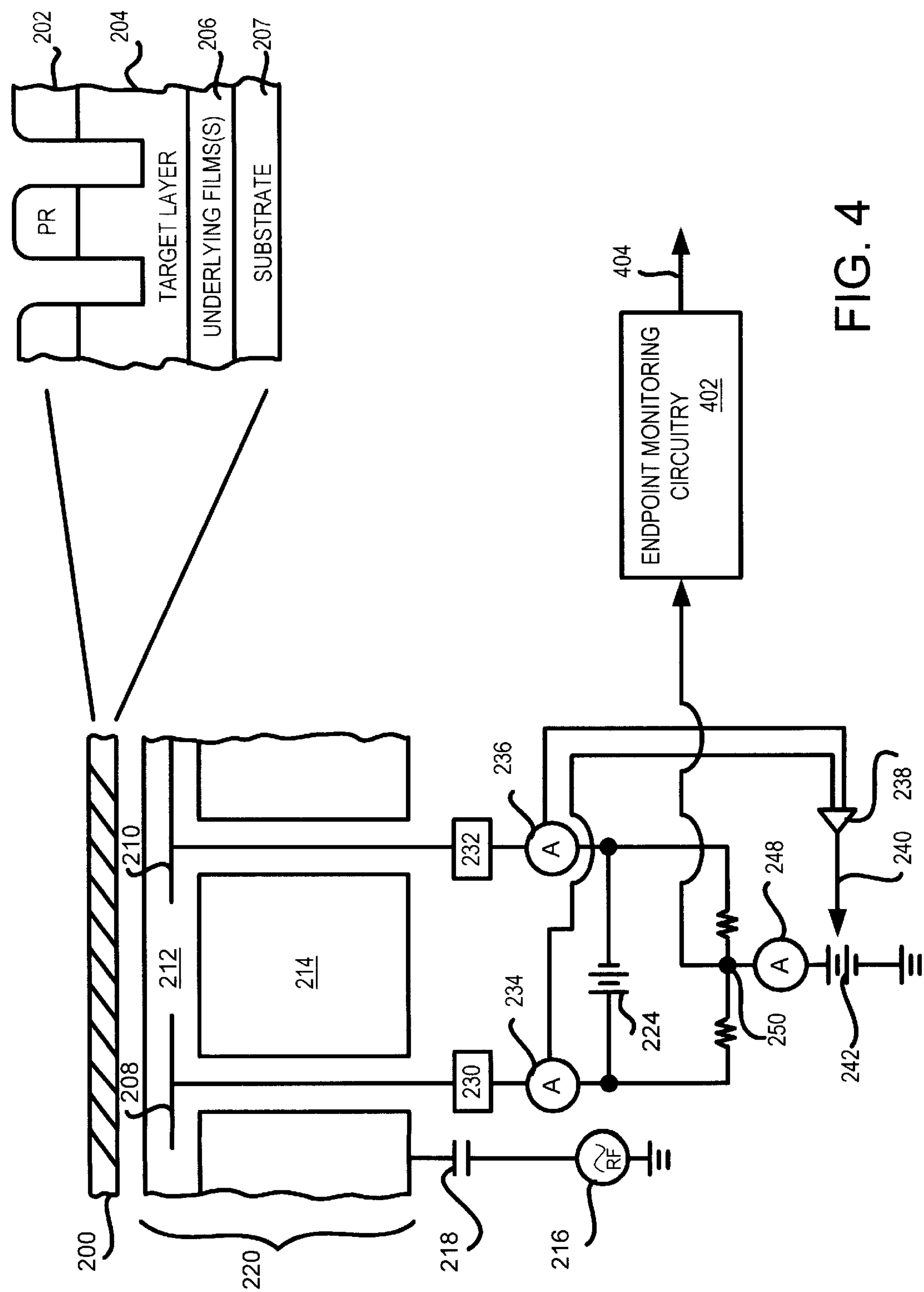
FIG. 4 illustrates, in accordance with one embodiment of the present invention, a simplified arrangement for monitoring the compensation voltage for the purpose of endpointing the etch.

FIG. 4 illustrates, in accordance with one embodiment of the present invention, a simplified arrangement for monitoring the compensation voltage for the purpose of endpointing the etch. In FIG. 4, the voltage at node 250 is input into endpoint monitoring circuitry 402, which outputs an endpoint signal 404 when the characteristic change indicative of the end of the etch process is ascertained. Monitoring circuitry 402 may represent, for example, programmable digital circuitry that has been programmed to analyze the input compensation voltage signal and to output a control signal 404 for endpointing the etch process. In one example, monitoring circuitry 402 represents a general purpose digital computer (e.g., a microcomputer) or a digital signal processor that has been programmed to analyze the digitized compensation voltage signal for changes indicative of the end of the etch process.

In accordance with another embodiment of the present invention, it is also possible to monitor control signal 240 itself for changes characteristic of the end of the etch for endpointing purposes. In accordance with yet another embodiment of the present invention, the currents through the legs themselves may be monitored (by, for example, monitoring the outputs of current monitor circuits 234 and 236) for changes in the current(s) that are indicative of the end of the etch process. This latter embodiment is particularly useful for chucks which do not employ compensation circuitry.

In accordance with another embodiment of the present invention, the difference in currents through the pole legs may be monitored indirectly by the current monitoring circuit 248, even in the absence of power supply 242.

As can be appreciated from the foregoing, many embodiments of the invention take advantage of existing signals in the electrostatic chuck power supply for the purpose of ascertaining when the end of the etch occurs in order to terminate the etch. In an indirect manner, changes in the currents supplied to the poles of the electrostatic chuck are employed to ascertain the etch progress for endpointing purposes. Unlike prior art techniques, the endpointing technique of the present invention does not require directly monitoring the self-induced bias of the substrate through the electrode (as was done in the case of FIG. 1). Accordingly, the technique works even with electrostatic chucks, which has a nonconductive dielectric layer disposed between the wafer and the body of the chuck.

In fact, the accurate determination of when the etch ends is possible even if there is a nonconductive layer disposed between the chuck's metallic body and the target layer. The presence of the nonconductive dielectric layer, either as part of the electrostatic chuck or within the substrate, would presumably have caused the prior art endpointing circuitry of FIG. 1 to fail to accurately provide an endpoint signal since the prior art technique depends on the direct measurement of the self-induced bias on the substrate through the electrode for endpointing purposes. Additionally, one of ordinary skills in the art would have assumed that the presence of a dielectric layer on the surface of the electrode and/or under the target layer would block the electrical path, rendering the direct monitoring of the self-induced bias on the substrate impossible and/or very difficult. Since the present invention does not rely on direct contact between the substrate and the electrode, the presence of a such a dielectric layer does not prevent the ascertaining of the end of the etch in the present invention.

It is also observed that the inventive endpointing technique is highly sensitive and is capable of accurately providing endpointing information even when etching substrates having a small fraction (or percentage) of the target layer exposed to the etching plasma. The sensitivity appears to increase if a conductive layer, e.g., a conductive metal or doped polysilicon interconnect layer, is disposed below the target layer to be etched. As alluded to earlier, the sensitivity of the present technique is such that the end of the etch process may be ascertained even if there is a dielectric layer disposed under the target layer. Furthermore, since endpointing does not depend on monitoring the optical emission of the plasma, the inventive technique also works irrespective of the etchant and/or additive gas employed.

While this invention has been described in terms of several preferred embodiments, there are alterations, permutations, and equivalents which fall within the scope of this invention. In general, it is proposed that the endpoint data can be derived from the changes in the substrate potential, which can in turn be obtained by looking at various signals at various points in the system. Thus, although the endpoint data can be ascertained by monitoring the changes in the current(s) flowing to the pole(s) of the ESC chuck (which reflect the changes in the substrate potential), there are other ways of obtaining this substrate potential-based endpoint data when an ESC chuck is involved. By way of example, a probe which contacts the backside of the substrate or some appropriate place on the substrate may be employed to measure the substrate potential directly throughout the etch, and the probe signal may be analyzed for changes indicative of the etch termination for endpointing purposes.

As another example, the leakage flow rate of coolant gas from the edges of the ESC chuck may be monitored during the etch, as an indirect measure of the substrate electric potential. This flow rate is dependent upon the clamping force of the ESC, which is, in turn, dependent upon the potential difference(s) between the ESC and the substrate. As the etch proceeds, detectable changes in the flow rate may arise due to changes in the substrate potential. In one embodiment, the leakage flow rate may be monitored in conjunction with or as part of a pressure control arrangement which supplies the coolant gas to the interface between the substrate and the ESC. The flow rate signal may be analyzed for changes indicative of the etch termination, for endpointing purposes.

In fact, given this disclosure, one of ordinary skills in the art will readily recognize that changes in the substrate potential impact other signals at various points in the plasma processing system. With the knowledge imparted by this disclosure, the identification of the possible signals and locations in a specific plasma processing system that may be monitored to ascertain the changes in the substrate potential is well within the skills of one familiar with plasma processing equipment. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for ascertaining an end of an etch process while etching through a target layer on a substrate in a plasma processing system, said plasma processing system including an electrostatic chuck having a first pole, a first DC power supply coupled to said first pole for supplying a chucking voltage to said first pole, a first current monitoring circuit coupled between said first pole and said first DC power supply for monitoring a first current supplied to said first pole, said first current monitoring circuit outputting a first signal indicative of said first current, and a variable DC power supply configured to output a compensation voltage for biasing said first DC power supply responsive to said first signal, thereby causing said chucking voltage to vary responsive to said compensation voltage, said method comprising:

coupling an endpoint monitoring circuit to said variable DC power supply, said endpoint monitoring circuit having an endpoint monitoring input and an endpoint monitoring output;

receiving at said endpoint monitoring input said compensation voltage;

analyzing, using said endpoint monitoring circuit, said compensation voltage for a pattern characteristic of said end of said etch process; and outputting at said endpoint monitoring output an endpoint signal indicative of said end of said etch process upon ascertaining said pattern in said compensation voltage.

2. The method of claim 1 wherein said electrostatic chuck includes a second pole coupled to said first DC power supply, said plasma processing system includes a second current monitoring circuit coupled between said second pole and said first DC power supply for monitoring a second current supplied to said second pole, wherein said compensation voltage output by said variable DC power supply is responsive to both said first signal and a second signal output by said second current monitoring circuit, said second signal being indicative of said second current.

3. The method of claim 2 wherein said plasma processing system includes a differential amplifier arrangement coupled to said first current monitoring circuit and said second current monitoring circuit, said differential amplifier arrangement receives said first signal and said second signal as input and outputs a control signal to said variable DC supply to cause said compensation voltage output by said variable DC power supply to vary responsive to both said first signal and said second signal.

4. The method of claim 2 wherein said first signal and said second signal is employed by said variable DC power supply to maintain said first current and said second current substantially constant during said etch process.

5. The method of claim 2 wherein said endpoint monitoring circuit includes a general purpose microcomputer.

6. The method of claim 2 wherein said electrostatic chuck represents a Johnsen-Rahbek chuck.

7. The method of claim 2 wherein said substrate includes a conductive layer underlying said target layer.

8. The method of claim 2 wherein said substrate includes a dielectric layer underlying said target layer.

9. The method of claim 2 wherein said target layer represents a silicon dioxide-containing layer, said substrate further includes a dielectric layer underlying said target layer.

10. The method of claim 2 wherein said target layer represents a low dielectric constant layer, said substrate further includes a dielectric layer underlying said target layer.

* * * * *